United States Patent
Coni et al.

(10) Patent No.: US 9,453,862 B2
(45) Date of Patent: Sep. 27, 2016

(54) MULTITOUCH TACTILE DEVICE WITH MULTI FREQUENCY AND BARYCENTRIC CAPACITIVE DETECTION

(71) Applicant: Thales, Neuilly sur Seine (FR)

(72) Inventors: Philippe Coni, Saint Jean d'illac (FR); Siegfried Rouzes, Le Haillan (FR)

(73) Assignee: Thales, Neuilly sur Seine (FR)

( * ) Notice: Subject to any disclaimer, the term of this patent is extended or adjusted under 35 U.S.C. 154(b) by 288 days.

(21) Appl. No.: 14/098,407

(22) Filed: Dec. 5, 2013

(65) Prior Publication Data
US 2014/0191769 A1    Jul. 10, 2014

(30) Foreign Application Priority Data

Dec. 5, 2012  (FR) .................................... 12 03298

(51) Int. Cl.
| | | |
|---|---|---|
| *G01R 27/26* | (2006.01) | |
| *G06F 3/041* | (2006.01) | |
| *G06F 3/044* | (2006.01) | |

(52) U.S. Cl.
CPC ............ *G01R 27/2605* (2013.01); *G06F 3/044* (2013.01); *G06F 3/0416* (2013.01); *G06F 2203/04104* (2013.01)

(58) Field of Classification Search
CPC . G01R 27/2605; G06F 3/044; G06F 3/0416; G06F 2203/04104
USPC ......................................................... 324/679
See application file for complete search history.

(56) References Cited

U.S. PATENT DOCUMENTS

| | | | | |
|---|---|---|---|---|
| 5,790,107 A | * | 8/1998 | Kasser | G06F 3/044 178/18.06 |
| 2010/0085325 A1 | * | 4/2010 | King-Smith | G06F 3/03545 345/174 |
| 2013/0033450 A1 | * | 2/2013 | Coulson | G06F 3/044 345/174 |
| 2013/0194225 A1 | * | 8/2013 | Shen | G06F 3/0416 345/174 |

(Continued)

FOREIGN PATENT DOCUMENTS

| | | |
|---|---|---|
| EP | 0 567 364 A1 | 10/1993 |
| EP | 2 196 889 k2 | 6/2010 |

OTHER PUBLICATIONS

Philippe Coni, et al., "Eliminating Ghost Touches on a Self-Capacitive Touch-Screen," XP002703949, SID Symposium Digest of Technical Papers, vol. 43, pp. 411-414 (Jun. 1, 2012).

(Continued)

*Primary Examiner* — Benjamin M Baldridge
(74) *Attorney, Agent, or Firm* — Blakely, Sokoloff, Taylor & Zafman LLP

(57) ABSTRACT

The general field of the invention is that of touchscreen devices with projected capacitive detection comprising a matrix touchpad comprising a plurality of conducting rows and of conducting columns, the matrix touchpad linked to an emission voltages electronic control system and a reception voltages electronic system. The emission voltages electronic control system generates two periodic emission voltages emitted at two different frequencies. The analysis of the reception voltages, by the reception voltages electronic system, makes it possible to determine the positions of two simultaneous presses on the touchpad, including when the two presses are done on rows or columns that are close. The determination of the presses is performed essentially by calculating the barycenters of the troughs of the reception voltages.

5 Claims, 4 Drawing Sheets

(56) References Cited

U.S. PATENT DOCUMENTS

| | | | | |
|---|---|---|---|---|
| 2013/0285934 A1* | 10/2013 | Ting | .................. | G06F 3/0488 345/173 |
| 2014/0022203 A1* | 1/2014 | Karpin | .................. | G06F 19/00 345/174 |
| 2014/0071071 A1* | 3/2014 | Hirose | .................. | G06F 3/0488 345/173 |
| 2014/0104188 A1* | 4/2014 | Bakken | .................. | G06F 3/044 345/173 |
| 2014/0144188 A1* | 5/2014 | Takei | .................. | C03B 37/01406 65/421 |
| 2014/0218057 A1* | 8/2014 | White | .................. | G06F 3/0414 324/686 |

OTHER PUBLICATIONS

French Search Report for French Counterpart Application No. FR 1203298, 8 pgs. (Aug. 19, 2013).

* cited by examiner

MULTITOUCH TACTILE DEVICE WITH MULTI FREQUENCY AND BARYCENTRIC CAPACITIVE DETECTION

BACKGROUND OF THE INVENTION

1. Field of the Invention

The field of the invention is that of tactile or "touchscreen" surfaces with capacitive detection and more particularly so-called "multitouch" tactile surfaces allowing the detection of two simultaneous presses. This function is essential for carrying out for example image "zooms" or rotations. This invention can apply in various uses but it is particularly well suited to the constraints of the aeronautical field and aircraft instrument panels.

2. Description of the Prior Art

So-called "projected" capacitive detection consists in producing a detection matrix arranged so as to detect the local variations in capacitance which are introduced by the proximity of the fingers of the user or of any other conducting pointing object. So-called projected capacitive technology comes in two main variants, namely:

"Self capacitive" detection which consists in reading the rows and then the columns of the array of touchkeys of the matrix:

So-called "Mutual capacitive" detection consisting in reading each intersection of the array of touchkeys of the matrix;

"Mutual capacitive" technology requires the reading of the whole of the pad. Thus, if the matrix comprises N rows and M columns, it is necessary to carry out N×M acquisitions, making it problematic to produce pads of large size, of high resolution and with low response time. Moreover, the capacitance to be measured under "Mutual capacitance" is lower than that obtained under "Self capacitive", thus making it problematic for the user to use gloves.

The advantage of "Self capacitive" detection is that, for the above pad, the system requires only N+M acquisitions to carry out a reading of the matrix. FIG. 1 illustrates this principle. In this FIG. 1, a first finger presses at the level of a first intersection of column $C_I$ and of row $L_J$ and a second finger presses at the level of a second intersection of column $C_K$ and of row $L_L$. The output voltages $V_{OUT}$ of the rows and columns exhibit easily identifiable drops in level. The measurements of the voltages around each drop in level make it possible to identify precisely the rows and columns invoked.

However, this latter technique exhibits a drawback. It is not always simple to ascribe the rows and the columns detected to the correct intersections actually touched by the user's fingers. Possible intersections, but which are not actually touched, are generally called "ghosts". To counter this difficulty, a technique consists in carrying out a scan of the matrix at two different acquisition frequencies. This technique is described in the publication "Eliminating Ghost Touches on a Self-Capacitive Touch-Screen" published in "SID 2012 DIGEST" of June 2012.

To properly understand this technique, it is necessary to use electronic models to represent a capacitive matrix device. There exists a simplified model for describing electrically a capacitive tactile device comprising a matrix of electrodes which is composed of conducting rows and of columns. It consists of a representation of a press where the operator's finger is coupled capacitively with the matrix by projecting the surface of his finger on the pad. This surface covers at least two electrodes, a first row-wise and a second column-wise. It is then considered that the operator adds a capacitance $C_d$ between the earth and at least the row or the column concerned. But this model remains local and does not take account of the environment of the measurement.

FIG. 3 represents a more elaborate model of a capacitive matrix device. Each row is in fact connected to a measurement and/or power supply device through analogue switches. These switches afford a coupling capacitance $C_m$ with respect to the ground and exhibit an electrical resistance $R_m$ causing an attenuation of the measured signal.

Moreover, each row consisting of a transparent material of ITO (Indium Tin Oxide) type which exhibits a certain resistance between the point of power supply and the point of contact of the finger, this resistance being all the higher the further away the finger is from the connection point. If $R_t$ is the resistance of a touchkey and of its connection to the next, then the resistance between the press on column n and the edge of the matrix is $n \cdot R_t$.

Furthermore, the array of rows and columns is mutually coupled. Indeed, there exists a capacitance $C_p$ at each crossover of tracks, each row being cut by n column and furthermore, the rows or column are coupled with their neighbours. This coupling is represented in FIG. 3 by a capacitance $C_{Ic}$. Finally, there also exist coupling capacitances between the touchpad, its connector arrangement and the mechanical items constituting the device, as well as a mutual coupling between the various tracks linking the rows and the columns to the electronic measurement device.

Consequently, the acquisition of a capacitive touchpad may not be reduced to the acquisition of a simple capacitance projected by an operator. It is the result of this projection on a multipole complex hardware component composed of an association of resistors and of capacitors that are mutually interconnected.

The "Dual-frequency self capacitive" device utilizes this complexity. As seen in FIG. 3, in the absence of any object in the neighbourhood of the matrix, each row $L_i$ is linked to an AC voltage power supply across an injection capacitance $C_i$ and to a reading buffer which possesses an input impedance consisting of a stray coupling capacitance relative to the ground $C_m$ and an input resistance $R_m$. This row $L_i$ possesses a lineal resistance and is coupled capacitively to each column crossover.

When a finger is placed on a precise point of the row $L_i$, it projects a capacitance onto the portion of the row considered. The tactile devices according to the prior art measure only this projected capacitance. This simple measurement does not make it possible to ascertain the position of the press on the row, this information not being conveyed by the value of the projected capacitance.

The heart of the device is not to consider simply the added capacitance, but its effect on the complex model constituted by the entire row. In particular, if the resistance $R_{il}$ of row $L_i$ of length l is considered, then there exists a resistance $R_{ia}$ between an end of the row and the contact point. The resistance $R_{ia}$ is less than $R_{il}$. This resistance value modifies the output signal $V_{OUT}$. This signal $V_{OUT}$ equals:

$V_{OUT} = Z \cdot V_{IN}$ with $V_{IN}$: periodic input signal of frequency F and Z: impedance of the row which equals:

$Z = A + Bj$ The terms A and B being functions of the capacitances $C_m$, $C_i$ and $C_d$ and the resistances $R_m$ and $R_{ia}$.

The topology of the model is akin to first order to an RC network or the resistance $R_{ia}$ associated with the capacitance $C_d$ constitutes a first-order low-pass filter. FIG. 4 represents, as a function of the applied frequency, the variation of the output signal of a row for three different positions of pressing, the first curve C1 for a press situated at a row edge, the second C2 for a press in the middle of a row, the third curve C3 for a press at the end of a row. The scale of FIG.

4 is logarithmic on both axes. There then exists, as seen in FIG. 4, a frequency $F_{MIN}$ such that the variations of $R_{ia}$ cause a minimum variation of $V_{OUT}$ whatever the position of the press. Note, for example, that in the absence of any press, a low value working frequency (x-axis) causes the reception voltages ($V_{OUT}$) to have minimal variations (y-axis). Conversely, there exists a frequency $F_{MAX}$, which also includes a high value discrimination frequency, such that the variations of $R_{ia}$ cause a significant attenuation (also referred to as distinguishable variations) of $V_{OUT}$ as a function of the position of the press. Thus, at this frequency $F_{MAX}$, by measuring this attenuation, it is then easy to ascertain the value of the resistance $R_{ia}$ and consequently, to determine the position of the contact point on the row.

This measurement is not necessarily very precise. It is however sufficient to determine the actual position of two simultaneous presses. Knowing, even approximately, through the double measurement at two different frequencies, the positions of the presses, the indeterminacy between the pair of actual presses and the pair of ghost presses or "ghosts" which corresponds thereto is lifted.

There still exist however certain configurations that may engender either an uncertainty in the position of the user's fingers or a positioning error. One of these configurations occurs when two fingers touch two neighbour rows or columns. This configuration is illustrated in FIG. 2. In this figure, the first finger presses at the level of a first intersection of column $C_I$ and of row $L_I$ and a second finger presses at the level of a second intersection of column $C_J$ and of row $L_{I+1}$. The output voltage $V_{OUT}$ of the columns exhibits two easily identifiable spikes making it possible to determine that columns $C_I$ and $C_J$ have been pressed. On the other hand, the output voltage $V_{OUT}$ of the rows exhibits a notch-gated form not making it possible to clearly identify the rows concerned, even using barycentric calculations of voltage.

SUMMARY OF THE INVENTION

The tactile device according to the invention does not exhibit these drawbacks. Its physical principle relies on the use of emission voltages at two different frequencies. It has been demonstrated that the output signals on the rows on the columns have, as a function of frequency, different impedances representative not only of the presence of a press on a row and a column but also of its position on this row and this column.

This device is totally "dual touch", it is insensitive to reading noise and to exterior electromagnetic disturbances and finally, it is compatible with the electromagnetic emission standards such as those specified in aeronautics. Moreover, the user can use this tactile surface with gloved hands with the same level of performance.

More precisely, the subject of the invention is a touch-screen device with projected capacitive detection comprising a matrix touchpad comprising a plurality of conducting rows and of conducting columns, the matrix touchpad linked to an emission voltages electronic control system configured to generate, for each conducting row and for each column, emission voltages and a reception voltages electronic system configured to receive and analyze reception voltages arising from each conducting row and from each column, the emission voltages electronic control system configured to generate, for each conducting row and for each column, a first periodic emission voltage emitted at a first frequency termed the working frequency and a second periodic emission voltage emitted at a second frequency termed the discrimination frequency, different from the first frequency;

in the absence of any press, as illustrated in FIG. 4 for example, a low value working frequency causes the reception voltages to have minimal variations at this working frequency and the a high value discrimination frequency causes the reception voltages to have distinguishable variations dependent on the rows and columns at this discrimination frequency;

the reception voltages electronic system (50) being arranged so as to determine, for each row and for each column:

The value of a first reception voltage at the working frequency and the value of a second reception voltage at the discrimination frequency;

If, as a function of predetermined values, the values of the two reception voltages are representative of two simultaneous presses on the touchpad and the location of these two presses on the two rows and on the two columns concerned;

characterized in that, in the case of two simultaneous presses, the first press situated at a first crossover of a first row and of a first column and the second press situated at a second crossover of a second row and of a second column, location of the two presses is performed by means:

a first analysis that pinpoints the "troughs" of the reception voltages for the first frequency and the "troughs" of the reception voltages for the second frequency corresponding to the voltage variations of the two presses;

a second analysis that calculates the barycentres of the voltage "troughs";

a third analysis that determines, on the basis of the knowledge of the barycentres, the first row and the first column corresponding to the first press and the second row and the second column corresponding to the second press.

Advantageously, when the first row is in the neighbourhood of the second row or when the first column is in the neighbourhood of the second column in such a way that the two variations in voltage corresponding to the two close rows or to the two close columns form one single trough, location of the two presses is performed by means:

Of the first analysis means making it possible to pinpoint the "troughs" of the reception voltages for the first frequency and the "troughs" of the reception voltages for the second frequency corresponding to the voltage variations of the two presses on the two neighbour rows or on the two neighbour columns;

Of second analysis means making it possible to calculate the barycentres of the two voltage "troughs";

Of third analysis means making it possible to determine on the basis of the knowledge of the said two barycentres the first neighbour row and the second neighbour row or the first neighbour column and the second neighbour column corresponding to the first press or to the second press.

Advantageously, the reception voltages electronic system comprises two synchronous demodulators, the first demodulator working at the working frequency, the second demodulator at the discrimination frequency.

Advantageously, the reception voltages electronic system comprises:

a table of the stored values of the reception voltages at the working frequency of each row and of each column in the absence of any press;

comparison means establishing, for each row and for each column, the discrepancies between the measured values of the reception voltages and the stored values of the reception voltages so as to determine whether the measured discrepancies are representative of a press on the row or on the column concerned.

Advantageously, the working frequency lies between 100 kHz and 500 kHz and the discrimination frequency lies between 500 kHz and 5 MHz.

BRIEF DESCRIPTION OF THE DRAWINGS

The invention will be better understood and other advantages will become apparent on reading the nonlimiting description which follows and by virtue of the appended figures among which.

DETAILED DESCRIPTION

Figure 1:
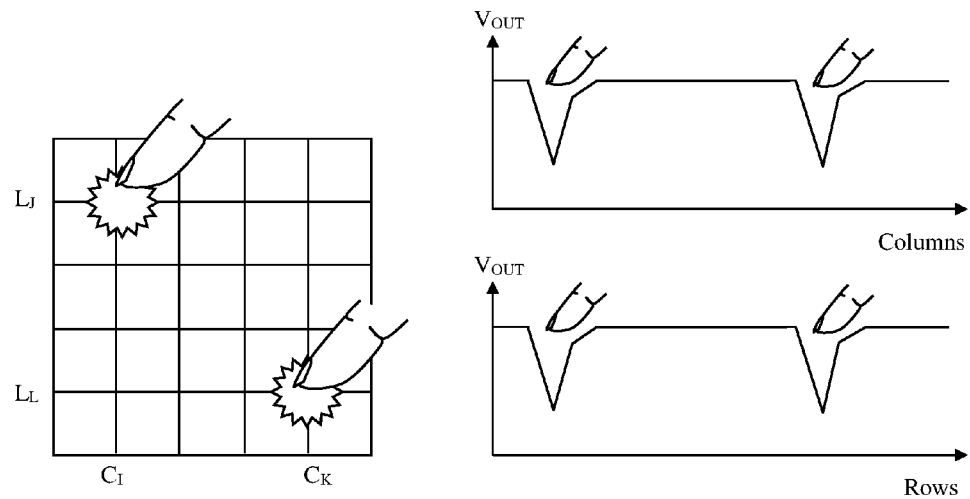
FIG. 1 already commented on represents the principle of capacitive detection of two simultaneous presses.
Figure 2:
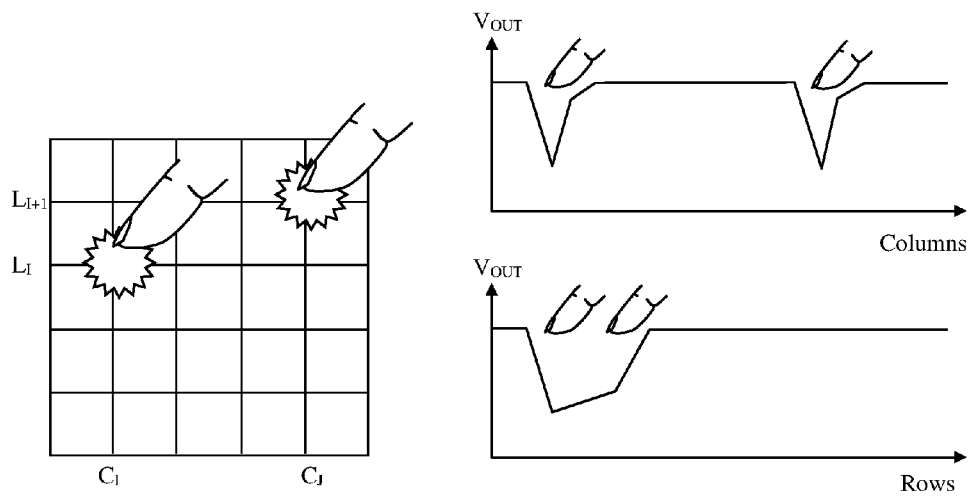
FIG. 2 already commented on represents the problem of the capacitive detection of two presses on two rows or two columns which are neighbours.
Figure 3:
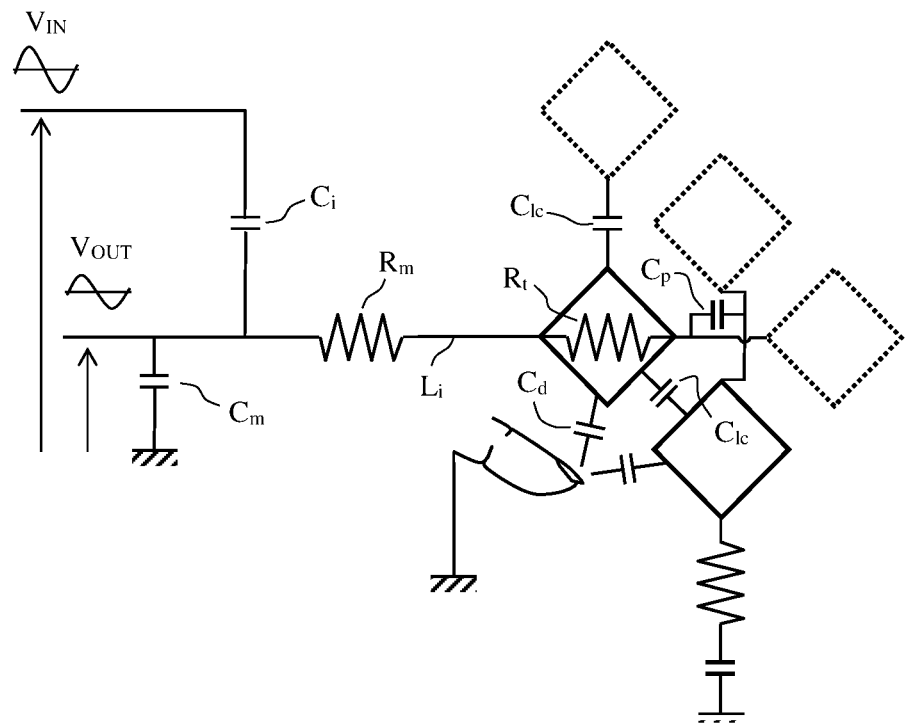
FIG. 3 already commented on represents the electrical diagram of the capacitances and electrical resistances around a crossover between a row and a column of a touchpad.
Figure 4:
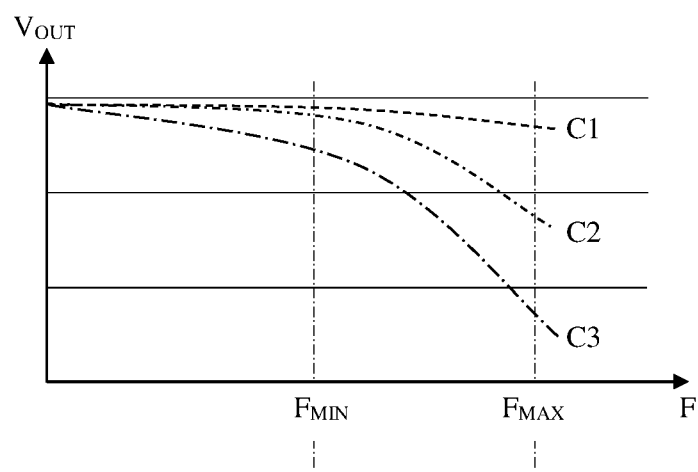
FIG. 4 already commented on represents, for two different frequencies, the variations of the output signal of a row or of a column as a function of the position of the press in a tactile device.
Figure 5:
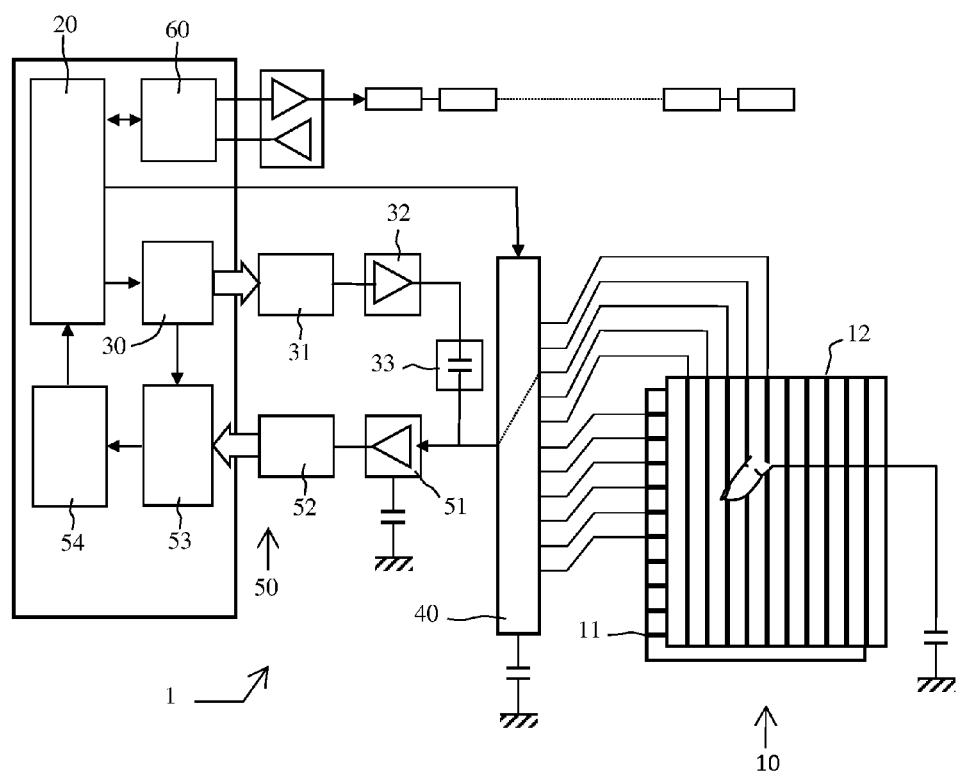
FIG. 5 represents the schematic of a projected capacitive tactile device according to the invention.

By way of nonlimiting example, FIG. 5 represents a device 1 with touchpad with projected capacitive detection according to the invention. It essentially comprises:
- a touchpad 10 comprising a first substrate comprising a first series of mutually parallel conducting rows 11 and a second substrate comprising a second series of mutually parallel conducting columns 12;
- means of control and analysis 20 (also referred to as an emission voltages electronic control system) of the various emission and reception signals necessary for the operation of the tactile device;
- A high-frequency sinusoidal generator 30 with variable frequency supplying the touchpad via alternating voltages $V_{IN}$ by way of a digital-analogue converter "DAC" 31, of an amplifier 32 and of an injection capacitor 33. Typically, the frequencies lie between a few hundred kHz and a few MHz;
- A multiplexer 40. It applies the input voltage $V_{IN}$ successively to each column 12 and then to each row 11 of the touchpad 10 and directs each output voltage $V_{OUT}$ corresponding to an applied voltage $V_{IN}$ towards an electronic processing chain 50 (also referred to as a reception voltages electronic system);
- An electronic processing chain 50 which comprises a buffer memory 51, an analogue-digital converter or ADC 52, a synchronous demodulator 53 linked to the frequency generator 30 and electronic filtering means 54. The filtered signals are dispatched to the analysis means 20;
- Transmission-reception means 60 or "UART" signifying "Universal Asynchronous Receiver Transmitter" which ensures the retransmission of the signals processed by the analysis means 20 to the outside which is generally a viewing device coupled with the touchpad and which displays information that it is desired to control, modify or validate.

The device operates as follows. In nominal mode, the rows and the columns of the pad are scanned permanently and successively by an input voltage $V_{IN}$ at a first working frequency $F_{MIN}$ and at a second so-called discrimination frequency $F_{MAX}$. This voltage is generated by the electronic assembly composed of the means 30, 31, 32 and 33.

During a press represented symbolically by a finger in FIG. 5 and according to the position of this press, a certain capacitance is created between the contact point and the ground, this capacitance being mainly linked by a resistance of rows and of columns to the multiplexer 40.

This resistive and capacitive component will cause a variation in the total impedance Z of the system, and act on the output signal $V_{OUT}$ which equals, as has been stated, $Z \cdot V_{IN}$ with $Z=A+Bj$. The signal $V_{OUT}$ is thereafter demodulated by the electronic chain 50 so as to extract therefrom the effective value $V_{OUT}=Z \cdot V_{IN}$, with $Z=A+Bj$ and $j=\sin(2\pi \cdot F \cdot t)$ by means of a synchronous demodulator 53. The synchronous demodulation makes it possible to filter the electromagnetic disturbances of "EMI" type by acting as a bandpass filter with high quality factor, thereby avoiding the use of rather unselective passive filterings.

Two measurements at least are performed, one at the working frequency $F_{MIN}$, and one at the discrimination frequency $F_{MAX}$. It is possible, for pads of significant dimension, to use several discrimination frequencies $F_{MAX}$. Advantageously, the frequencies $F_{MIN}$ and $F_{MAX}$ are modulated and demodulated separately by means of two synchronous demodulators 53, thereby making it possible to obtain in a single measurement the values of the capacitance C and of the resistance R, which are representative of the position of the press. Finally, the filtered continuous signal arising from the demodulator 53 is filtered by means of the filtering 54.

In the absence of approach of the hand, the tactile controller permanently effects an image of the pad at the frequency $F_{MIN}$ and deduces therefrom a quiescent table of the impedances by sliding average. This image is subtracted from the table of the instantaneous values of the impedances, to form the table of the discrepancies, on the basis of which it is possible to ascribe to each crossover point its status. This scheme is in part described in patent EP 0 557 364 entitled "Process for operating a capacitive tactile keyboard".

The use of two different measurement frequencies has a significant advantage. In the case of nonaligned multiple presses, the quadruple of points is measured at the frequency $F_{MIN}$, and then at the frequency $F_{MAX}$. The signal variation subsequent to the frequency variation is used to determine the refection of the ghost presses and the quadruple of points makes it possible to give the coordinates of the various presses.

To obtain more details on the position of the presses, location of the presses is performed by means:
- Of first analysis means making it possible to pinpoint the "troughs" of the reception voltages for the working frequency and the "troughs" of the reception voltages for the discrimination frequency corresponding to the voltage variations of the presses;
- Of second analysis means making it possible to calculate the barycentres of the voltage "troughs";
- Of third analysis means making it possible to determine, on the basis of the knowledge of the barycentres, the rows and the columns corresponding to the various presses.

By way of example, a determination of a barycentre is performed by determining the minima or "troughs" of the reception voltages $V_{OUT}$. A minimum corresponds to a particular row or to a column. Hereinafter in this paragraph, for simplicity, by choice, only the minima of the reception voltages of the rows are of interest. Of course, the method is valid for the columns. Around a row $L_{MIN}$ corresponding to a minimum, for a determined number of rows situated on either side of this row $L_{MIN}$, the barycentre of the said rows is calculated, each row being assigned a coefficient equal to the value of the output voltage of the said row. This barycentre corresponds to the position of the pressing point. It is of course possible to refine the scheme by determining, for example, the voltage slopes surrounding a voltage minimum.

Figure 6:
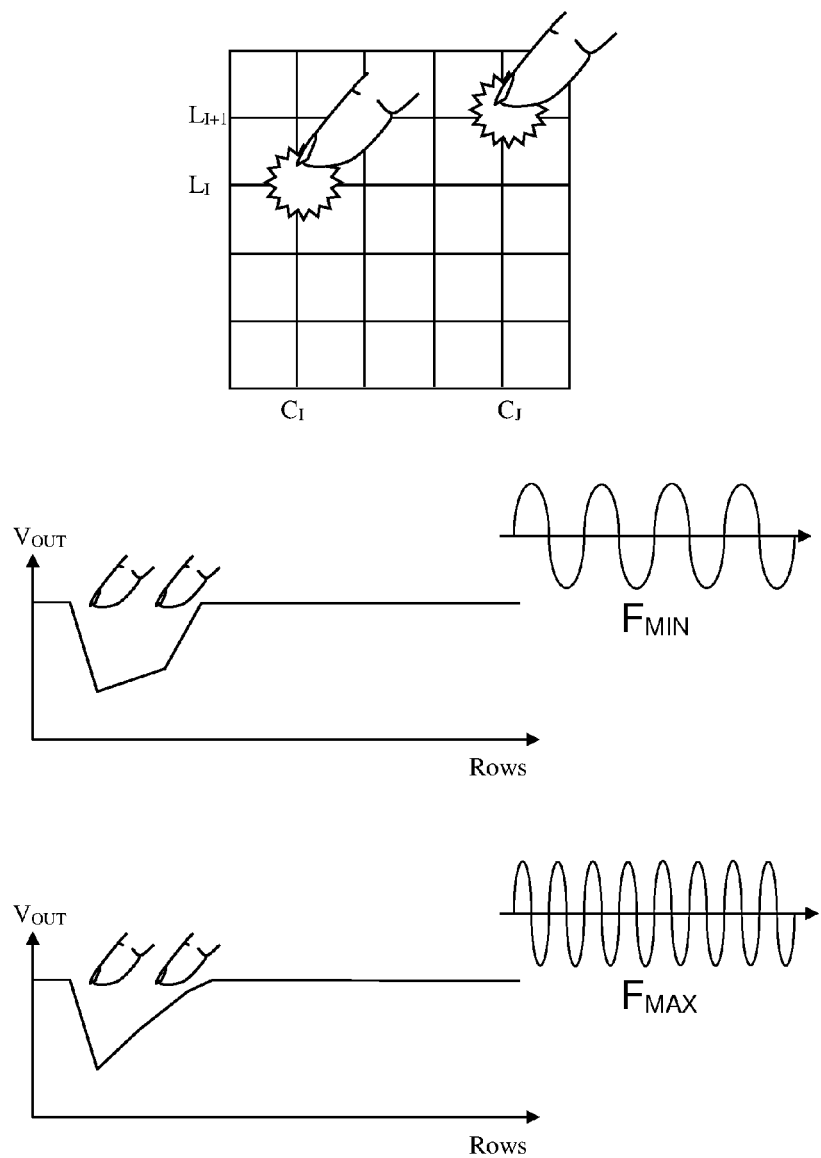
FIG. 6 represents the principle of the detection and of the identification of two presses on two rows or two columns which are neighbours.

The barycentric scheme makes it possible to improve the precision in position of the presses. It has another advantage when it is coupled with the measurement at two different frequencies. Indeed, as illustrated in FIG. 6, when, in the case of two simultaneous presses, the first press situated at a first crossover of a first row and of a first column and the second press situated at a second crossover of a second row and of a second column and when the first row is in the neighbourhood of the second row or when the first column is in the neighbourhood of the second column in such a way that the two variations in voltage corresponding to the two close rows or to the two close columns comprise one single voltage trough, it is possible to determine precisely the rows and the columns invoked. Indeed, as seen in FIG. 6, at the working frequency, the reception voltage corresponding to the two presses that are situated, for example, on two neighbour rows $L_I$ and $L_{I+1}$, will give a single voltage trough not making it possible to simply determine the rows invoked. It is only possible to determine the barycentre of the two presses. On the other hand, at the discrimination frequency, the voltage trough corresponding to one of the two presses is attenuated. There now remains only a single voltage trough making it possible to unambiguously determine the first row, for example $L_I$, corresponding to one of the two presses. It then becomes easy, knowing the barycentric position of this first press and the barycentric position of the two presses together, to determine the second row $L_{I+1}$ corresponding to the second press.

As seen, the electronic means implemented in the tactile device according to the invention are simple and make it possible to solve effectively the main problems of projected capacitive detection, that is to say the detection of ghost presses, the detection of close presses, the insensitivity to external electromagnetic disturbances that is due to synchronous detection and the absence of disturbances of the electronic environment through the use of pure sinusoidal signals without harmonics.

What is claimed is:

1. A touchscreen device with projected capacitive detection comprising:
    a matrix touchpad comprising a plurality of conducting rows and of conducting columns, the matrix touchpad linked to an emission voltages electronic control system that generates, for each conducting row and for each column, emission voltages, and a reception voltages electronic system that receives and analyzes reception voltages arising from each conducting row and from each column,
    wherein the emission voltages electronic control system is configured to generate, for each conducting row and for each conducting column, a first periodic emission voltage at a first frequency and a second periodic emission voltage at a second frequency different from the first frequency:
    wherein, in the absence of a press on the touchscreen, the first periodic emission voltage at the first frequency causes the reception voltages to have minimal variations; and wherein the second emission voltage at the second frequency causes the reception voltages to have distinguishable variations dependent on the rows and columns;
    wherein the reception voltages electronic system determines, for each row and for each column, the value of a first reception voltage at the first frequency and the value of a second reception voltage at the second frequency; and if the values of the two reception voltages are determined by the reception voltages electronic system to be representative of two simultaneous presses on the touchpad, location of the two presses is performed,
    wherein a first analysis determines the minima of the reception voltages for the first frequency and the minima of the reception voltages for the second frequency corresponding to the voltage variations caused by the two presses on the touchscreen; and
    a second analysis calculates positions of barycentres of the voltage minima; and
    a third analysis determines, based on the positions of the barycentres, the first row and the first column corresponding to the first press and the second row and the second column corresponding to the second press.

2. The touchscreen device according to claim 1, wherein, when the first row is adjacent to the second row or when the first column is adjacent to the second column in such a way that the two variations in voltage corresponding to the two adjacent rows or to the two adjacent columns form one single minimum, location of the two presses is performed, wherein
    the first analysis determines the minima of the reception voltages for the first frequency and the minima of the reception voltages for the second frequency corresponding to the voltage variations of the two presses on the two adjacent rows or on the two adjacent columns;
    the second analysis calculates the positions of the barycentres of the two voltage minima;
    the third analysis determines, based on the said positions of the two barycentres, the first adjacent row and the second adjacent row or the first adjacent column and the second adjacent column corresponding to the first press or to the second press.

3. The touchscreen device according to claim 1, wherein the reception voltages electronic system comprises two synchronous demodulators, wherein the first demodulator operates at the first frequency, and the second demodulator operates at the second frequency.

4. The touchscreen device according to claim 1, wherein the reception voltages electronic system comprises:
    a table of the stored values of the reception voltages at the first frequency for each row and each column in the absence of a press;
    wherein the reception voltages electronic system performs a comparison analysis establishing, for each row and for each column, the differences between the measured values of the reception voltages and the stored values of the reception voltages so as to determine whether the differences represent a press on the row or on the column.

5. The touchscreen device according to claim 1, wherein the first frequency is between 100 kHz and 500 kHz and the second frequency is between 500 kHz and 5 MHz.

* * * * *